US008888557B2

(12) United States Patent
Tanaka

(10) Patent No.: US 8,888,557 B2
(45) Date of Patent: Nov. 18, 2014

(54) METHOD AND APPARATUS FOR MANUFACTURING A SEMICONDUCTOR DEVICE

(75) Inventor: Yoko Tanaka, Yokohama (JP)

(73) Assignee: Fuji Electric Co., Ltd. (JP)

(*) Notice: Subject to any disclaimer, the term of this patent is extended or adjusted under 35 U.S.C. 154(b) by 456 days.

(21) Appl. No.: 13/414,925

(22) Filed: Mar. 8, 2012

(65) Prior Publication Data

US 2012/0231705 A1  Sep. 13, 2012

(30) Foreign Application Priority Data

Mar. 11, 2011 (JP) .................................. 2011-054332

(51) Int. Cl.
*B24B 7/04* (2006.01)

(52) U.S. Cl.
USPC ............... 451/41; 451/54; 451/287; 451/289; 451/290; 451/388

(58) Field of Classification Search
USPC ............... 451/41, 54, 63, 285, 287, 289, 290, 451/388; 438/691, 692; 257/E21.237
See application file for complete search history.

(56) References Cited

U.S. PATENT DOCUMENTS

| 7,858,530 | B2* | 12/2010 | Kajiyama et al. | 438/716 |
|---|---|---|---|---|
| 2003/0082914 | A1* | 5/2003 | Koma et al. | 438/690 |
| 2003/0235937 | A1* | 12/2003 | Mong et al. | 438/106 |
| 2004/0161882 | A1* | 8/2004 | Teshirogi et al. | 438/151 |
| 2005/0260829 | A1* | 11/2005 | Uematsu et al. | 438/460 |
| 2007/0004180 | A1* | 1/2007 | Abe | 438/460 |
| 2007/0141955 | A1* | 6/2007 | Masuda | 451/11 |
| 2008/0090505 | A1* | 4/2008 | Yoshida et al. | 451/413 |
| 2009/0117709 | A1* | 5/2009 | Abe | 438/460 |
| 2009/0186563 | A1* | 7/2009 | Takahashi et al. | 451/57 |
| 2010/0261309 | A1* | 10/2010 | Tateishi | 438/107 |
| 2013/0203241 | A1* | 8/2013 | Nakata et al. | 438/464 |
| 2013/0267065 | A1* | 10/2013 | Nakata et al. | 438/118 |
| 2013/0273691 | A1* | 10/2013 | Pascual et al. | 438/107 |
| 2013/0323907 | A1* | 12/2013 | Oosterhuis et al. | 438/460 |
| 2014/0073067 | A1* | 3/2014 | Uchida | 438/5 |
| 2014/0113413 | A1* | 4/2014 | Yamamoto et al. | 438/118 |
| 2014/0170938 | A1* | 6/2014 | Duescher | 451/41 |

FOREIGN PATENT DOCUMENTS

| JP | 2004-216485 A | 8/2004 |
|---|---|---|
| JP | 2007-173487 A | 7/2007 |
| JP | 2007-258206 A | 10/2007 |
| JP | 2009-059763 A | 3/2009 |
| JP | 2009-094247 A | 4/2009 |
| JP | 2010-177228 A | 8/2010 |

* cited by examiner

Primary Examiner — Eileen P. Morgan
(74) Attorney, Agent, or Firm — Rossi, Kimms & McDowell LLP

(57) ABSTRACT

A method of transporting a semiconductor wafer having a ring-shaped stiffening portion can include the steps of pressing the semiconductor wafer from the back surface side to the front surface side thereof on a place different from a place at which the semiconductor wafer is to be held, the step of pressing the semiconductor wafer being conducted before holding the semiconductor wafer having the ring-shaped stiffening portion. The method can include releasing the attachment by suction of the front surface of the semiconductor wafer by supplying a positive pressure onto the chuck table, releasing pressing the semiconductor wafer from the back surface side to the front surface side thereof on the place different from the place at which the semiconductor wafer is to be held and picking up the semiconductor wafer having the ring-shaped stiffening portion from the chuck table while holding the semiconductor wafer.

19 Claims, 16 Drawing Sheets

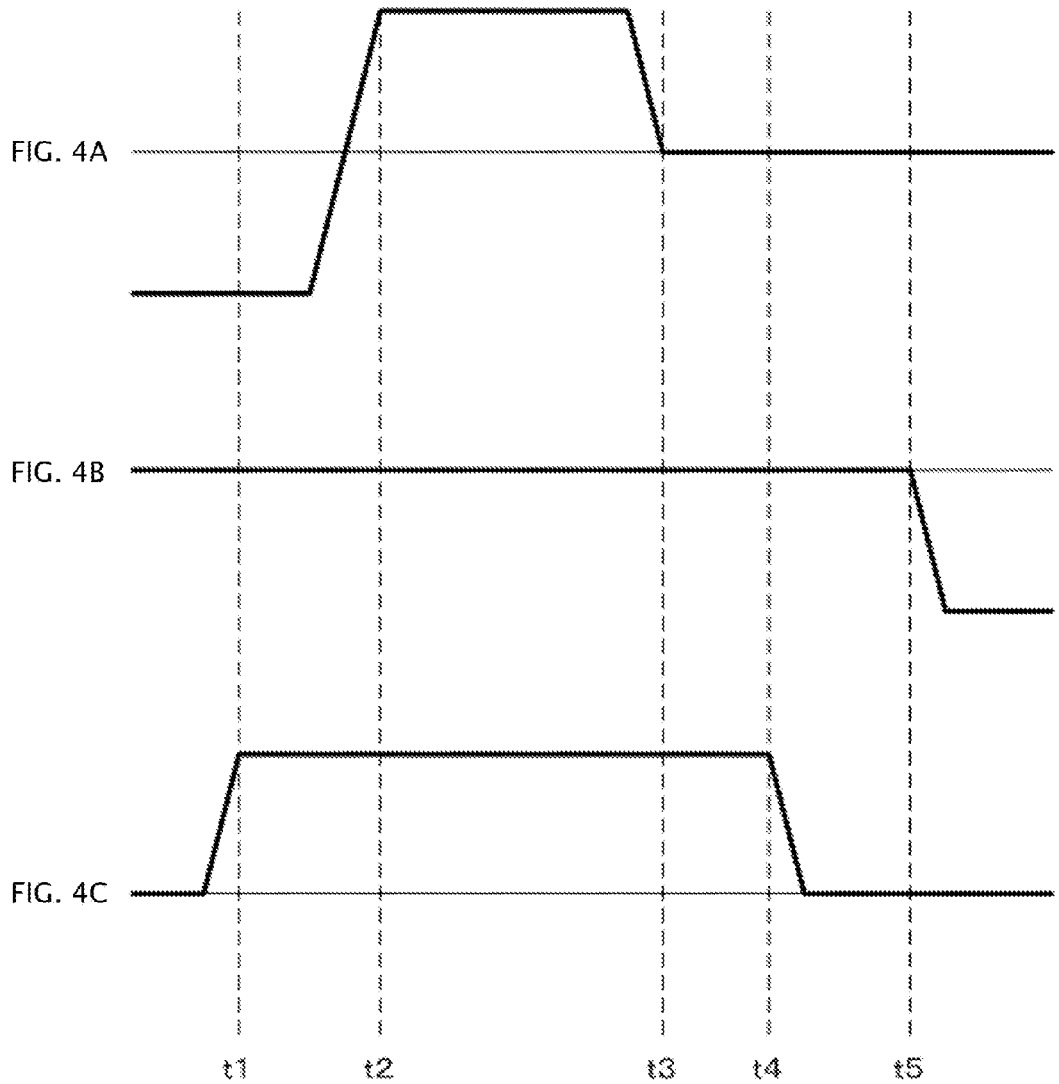

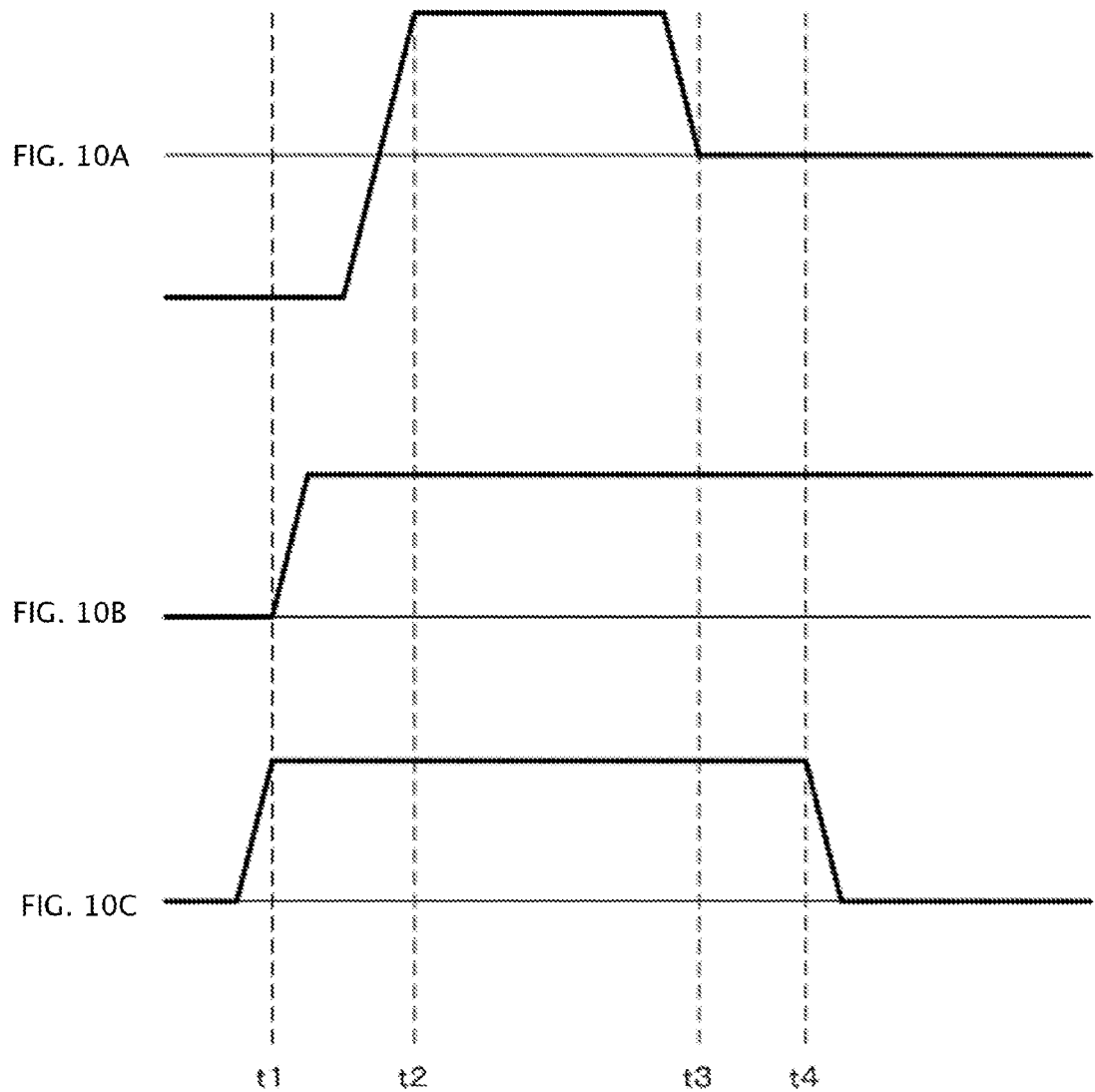

METHOD AND APPARATUS FOR MANUFACTURING A SEMICONDUCTOR DEVICE

BACKGROUND OF THE INVENTION

1. Field of the Invention

Embodiments of the invention relate to methods and apparatuses for manufacturing a semiconductor device, and, in particular, to methods and apparatuses for manufacturing thin semiconductor devices such as power semiconductor devices used in power conversion devices.

2. Description of the Related Art

In power semiconductor devices represented by IGBTs (insulated gate bipolar transistors), methods are being developed to reduce the thickness of semiconductor substrates or wafers for producing semiconductor devices to achieve high performance of the devices. In addition, wafers with enlarged diameters are being developed to increase the number of power semiconductor elements that can be formed of a sheet of wafer, thereby reducing the costs of the semiconductor devices.

The reduction in wafer thickness, however, in certain circumstances, may cause a break at the peripheral edge of the wafer resulting in chipping of the wafer. Because thin wafers can show lowered mechanical strength, a problem can also arise that the wafer is liable to generate cracks, breakage, and deflection. These problems are noticeable in wafers with a large diameter, in particular. Thin and large diameter wafers showing large deflection have difficulties in transporting the wafer between manufacturing steps and in positioning the wafer on manufacturing devices.

The manufacturing process of vertical power semiconductor devices typically includes the steps of ion implantation, heat treatment (annealing), metallic film deposition, etc., also on the back surface of the wafer. Hence, the above-mentioned problems can cause difficulty in carrying out these steps on the back surface of the wafer.

In order to solve or minimize such problems, a wafer has been proposed that has a ring-shaped stiffening portion at the periphery of the back surface side of the wafer to reinforce the wafer having a reduced thickness. The wafer having a ring-shaped stiffening portion has the periphery of the back surface side thicker than the central portion of the wafer. Use of the wafer having a ring-shaped stiffening portion substantially reduces warp and deflection of the wafer and enhances strength of the wafer in handling the wafer in the transport step, preventing the wafer from generation of breakage and chipping.

FIGS. 12A through 12D show shapes of a wafer having a ring-shaped stiffening portion. FIG. 12A shows a wafer with an orientation flat 110 having a ring-shaped stiffening portion 111 at the periphery of the wafer.

FIG. 12B shows a wafer with a notch 120 having a ring-shaped stiffening portion 121 at the periphery of the wafer.

The inner portion of both the wafers inside the ring-shaped stiffening portion is a region for forming semiconductor device elements.

Japanese Unexamined Patent Application Publication No. 2007-173487 (also referred to herein as "Patent Document 1"), for example, discloses a method for fabricating a wafer having the ring-shaped stiffening portion. The method uses a grinding apparatus provided with a grinding member having a diameter smaller than that of the wafer and grinds the central portion of the wafer thin leaving the peripheral portion of the back surface side of the wafer to form a rib.

FIGS. 13A and 13B are simplified sectional views showing a grinding step in the process of fabricating a wafer having the ring-shaped stiffening portion.

The following describes a step of fabricating a wafer having the ring-shaped stiffening portion with reference to FIGS. 13A and 13B. The wafer 20 is first set in a cassette (not depicted) of a grinding apparatus. The wafer 20, after positioning by a transport robot or the like, is then transported above a chuck table 10 and put on the surface of an attachment plate 12 of the chuck table 10. The chuck table 10 is connected to a vacuum system (not depicted) that supplies a negative pressure through the attachment plate 12 to attract and hold the wafer 20 as shown in FIG. 13A. The attachment plate 12 is made of porous ceramics, for example.

The grinding apparatus is provided with a grinding member 133 having a diameter smaller than that of the wafer. The grinding member 133 has a grindstone on the contact surface with the wafer. The grinding member 133 rotates on its own axis and the axis itself turns around on the wafer to grind the central portion of the wafer.

The grinding apparatus grinds only a central portion of the wafer leaving the peripheral portion with just the thickness as of the original wafer inputted to the grinding apparatus. Thus, a wafer 22 is fabricated having the central portion ground to a thin desired thickness as shown in FIG. 13B. FIG. 12C shows a cross-section of a thin fabricated wafer, which has a ring-shaped stiffening portion 122 (a rib structure) at the periphery of the wafer.

FIGS. 14A, 14B, and 14C are sectional views of essential parts in another example of grinding step in the process for fabricating a wafer having the ring-shaped stiffening portion.

The grinding apparatus of FIGS. 14A, 14B, and 14C is provided with two grinding members 131 and 132 containing abrasive grains of different grain sizes, whereas the grinding apparatus of FIGS. 13A and 13B has a single grinding member 133.

In the grinding step of FIGS. 14A, 14B, and 14C, a semiconductor wafer 20 before grinding, which can be an eight inch wafer having a thickness of 725 μm, for example, after positioning by a transport robot (not depicted) or the like, is transported on a chuck table 10 and held by suction on the surface of an attachment plate 12. In the first grinding step, as shown in FIG. 14A, the central portion of the wafer 20 is ground using a grinding member 131 that is provided with a grindstone containing abrasive grains having a relatively large average grain size. The grinding step is conducted on the central portion of the wafer 20 down to a predetermined remaining thickness of 100 to 150 μm, for example, leaving the peripheral portion with a width of 1 to 5 mm, for example. After the central portion is ground to the desired thickness, the second grinding step is conducted, as shown in FIG. 14B, using a grinding member 132 that is provided with a grindstone containing abrasive grains having a smaller average grain size than that of the grindstone provided on the grinding member 131. The second grinding step grinds the back surface of the wafer processed by the first grinding step down to a predetermined thickness of 60 to 120 μm, for example, on the region with an inner circumference diameter smaller than that of the recessed inner circumference formed by the first grinding step. Thus, a wafer 23 having a ring-shaped stiffening portion is fabricated as shown in FIG. 14C. Here, the second grinding step grinds the wafer to an inner diameter that is smaller than the recessed inner diameter formed in the first grinding step, because positioning accuracy of the grinding machine used in the second grinding step is taken into consideration Thus, the grinding member 132 used in the second grinding step does not become in contact with the side wall of the ring-shaped stiffening portion that is formed in the first grinding step.

The wafer is ground only on the central portion leaving the peripheral portion of the wafer. Thus, a wafer 23 as shown in FIG. 14C is fabricated that is machined to a desired thickness only on the central portion of the wafer, leaving the peripheral portion with the thickness as inputted into the grinding apparatus. FIG. 12D is a section view of the wafer having a ring-shaped stiffening portion (a rib structure) 123 at the periphery of the wafer.

The wafer having the ring-shaped stiffening portion formed at the peripheral region of the wafer is transferred to the next step for cleaning and drying. A transport device, not depicted in FIGS. 13A, 13B, 14A, 14B, and 14C, picks up the wafer from the attachment plate 12 of the chuck table 10 and transported to the predetermined destination.

For transporting a wafer having a ring-shaped-stiffening portion (a rib structure), Japanese Unexamined Patent Application Publication No. 2009-059763 (also referred to herein as "Patent Document 2"), for example, discloses a construction in which the upper surface of the ring-shaped portion is attracted by evacuation suction to transport the wafer.

In the process of grinding by a grinding apparatus to form the ring-shaped stiffening portion at the periphery of the wafer, the process is generally conducted in consecutive steps.

After a grinding step is finished, the wafer having the ring-shaped stiffening portion (a rib structure) is removed from the chuck table and transferred to the next step of cleaning and drying. At the same time, the attachment plate on the chuck table is cleaned with a blush or the like, and the next wafer to be ground is supplied and held by suction on the chuck table.

FIGS. 15A, 15B, and 15C show conventional apparatus and process for transporting a wafer. A wafer 22 after completion of the grinding step and having a ring-shaped stiffening portion formed in the step is removed from the chuck table 10 and transferred to the next step by a transport device 80. The transport device 80 is provided with an attracting member 81 at the lower end of a support member 82 and transmits a negative pressure from a vacuum system (not depicted) to the bottom surface of the attracting member 81 through a supply and exhaust system (not depicted) inside the support member 82. The attracting member 81 attracts the thin central portion of the wafer 22 by suction as shown in FIG. 15A. The wafer 22 is removed from the chuck table 10 by elevating the support member 82 with the attracting member 81 attracting the thin region of the wafer 22.

While a wafer may be attracted only at the ring-shaped stiffening portion as disclosed in Patent Document 2, enough attraction so as to pick up and transport the wafer requires a flat and enough area of the upper surface of the ring-shaped stiffening portion to be attracted. The large area of the flat upper surface decreases the area of the central portion of the wafer, which is a device-forming region.

Attracting the wafer at the central portion thereof as shown in FIG. 15A ensures an area necessary for attracting the wafer and transportation without failure.

Alternatively, as shown in FIG. 16A, the wafer after completion of the grinding step having a ring-shaped stiffening portion can be held at the outer peripheral end of the wafer by a holding member 92 provided at the end of an arm 91 of a transport device 90. The arm 91 of the transport device 90 is movable so that the holding member 92 can approach and leave the ring-shaped stiffening portion of the wafer 22. The holding member 92 moves from a position apart from the ring-shaped stiffening portion and holds the wafer 22 at the ring-shaped stiffening portion thereof. The arm 91 is then elevated while holding the ring-shaped stiffening portion of the wafer 22 with the holding member 92 to remove the wafer 22 from the chuck table 10. This procedure allows the wafer 22 to be transferred to the next step without touching the thinned portion of the wafer 22.

The process including the grinding step needs to be consecutive. The total time required for the consecutive process should be decreased, the consecutive process on the wafer including: transfer, placing, grinding, picking up, cleaning of the chuck table, and transfer to the next wafer. In the step of picking up the wafer to transfer to the next step, in particular, two problems must be solved simultaneously: to shorten the time for picking up the wafer and to prevent the wafer from any damage.

The chuck table 10 has the cleaning water dropped on the wafer in the grinding step and the cleaning water used in the cleaning process of the chuck table 10 remained on the attachment plate 12 (FIG. 15A) or a combined attachment plate of 13 and 14 (FIG. 16B). The attachment plate 12 (FIG. 15A) or a combined attachment plate of 13 and 14 (FIG. 16B) is referred to as the attachment plate 12 or 13 and 14' in the following.

If the cleaning water is remained between the wafer 22 and the attachment plate 12 or 13 and 14, the wafer 22 is adhered to the attachment plate 12 or 13 and 14 due to the surface tension of the cleaning water. In the grinding step for forming the ring-shaped stiffening portion, a negative pressure is supplied onto the attachment plate 12 or 13 and 14 from a vacuum system (not depicted) through a supply and exhaust path 11. After the grinding step, the negative pressure is released from the attachment plate 12 or 13 and 14 on the chuck table 10. However, after the release of the negative pressure, the presence of the cleaning water still inhibits the progress of air leakage through the porous attachment plate 12 or 13 and 14 of the chuck table 10 and causes the wafer 22 remaining adhered onto the attachment plate 12 or 13 and 14. If the wafer 22 were left on the attachment plate 12 or 13 and 14 for a long period of time for example ten minutes, after the release of the negative pressure, the air leakage through the attachment plate 12 or 13 and 14 would be advanced and the wafer 2 would become easy to be removed. This means, however, leaves the problem to reduce the time required for picking up the wafer unsolved and lowers the efficiency of the transport operation.

If the wafer 22 adhered to the attachment plate 12 or 13 and 14 were forced to be separated, the thin wafer 22 vulnerable to break would cause chipping and cracking. Thus, the problem to pick up the wafer with no damage is left unsolved.

The time duration for picking up the wafer 22 can be shortened by supplying, after release of the negative pressure, water, air, or a mixture thereof (indicated by the reference symbols 70 and 71 in FIGS. 15B, 15C and 16B) to the attachment plate 12 or 13 and 14 on the chuck table 10 through the supply and exhaust path 11. A positive pressure is given to the surface of the attachment plate 12 or 13 and 14 on the chuck table 10 by blowing up the water, air, or the mixture thereof (70, 71) through the attachment plate. The wafer after releasing adhesion to and separation from the attachment plate on the chuck table 10 is transferred to the next step by the transport device (80 in FIG. 15A, 90 in FIGS. 16A and 16B).

The blowing up of the water, air, or a mixture thereof 70, 71 shown in FIGS. 15B, 15C, and FIG. 16B causes deformation in the wafer 22. Stress concentration is liable to be developed especially at places damaged by the grindstone in the grinding step and places with varied curvature. Such places are indicated by the symbol 223 in FIG. 13B and the symbol 233 in FIG. 14C.

The deformation of the wafer 22 is very likely to occur at the part B indicated in FIG. 15C where the wafer 22 is pushed by the attracting member 81 of the transport device 80 and at the part B indicated in FIG. 16B where the wafer 22 varies in thickness thereof.

The wafer 22 undergoes occurrence of cracks on the ground surface thereof due to such deformation that makes the wafer locally float apart as indicated by the arrow A in FIG. 15C and FIG. 16B. Thus, there is a need in the art for an improved method and apparatus for manufacturing semiconductor devices.

SUMMARY OF THE INVENTION

Embodiments of the invention are directed to these and other needs, and to provide for a method and apparatus for manufacturing a semiconductor device that allows a wafer to be picked up safely and securely after the wafer is attracted on a chuck table and ground on the surface thereof.

In certain embodiments, a front surface of a semiconductor wafer is attracted to an attachment plate of a chuck table and a back surface of the semiconductor wafer is ground in a inside region to a recessed configuration leaving a ring-shaped stiffening portion at a periphery of the wafer. In a procedure of transporting the semiconductor wafer having the ring-shaped stiffening portion from the chuck table, before holding the wafer having the ring-shaped stiffening portion, the semiconductor wafer is pushed at a place different from a place to be held from the back surface side to the front surface side. A positive pressure is supplied to the chuck table to release adhesion of the front surface of the semiconductor wafer. After releasing the pressure against the semiconductor wafer at the different place from the place to be held from the back surface side to the front surface side, the semiconductor wafer having the ring-shaped stiffening portion is picked up from the chuck table while being held.

In some embodiments, a wafer can be safely and surely picked up and transported smoothly to the predetermined destination preventing the wafer from chipping and cracking.

BRIEF DESCRIPTION OF DRAWINGS

FIGS. 4A, 4B, and 4C are timing charts in the first embodiment according to the present invention;

FIGS. 5A and 5B show an essential part of a transport device in the first embodiment according to the present invention, in which FIG. 5A is a sectional view and FIG. 5B is a perspective view;

FIGS. 10A, 10B, and 10C are timing charts in the second embodiment according to the present invention;

DETAILED DESCRIPTION

Now, some aspects of embodiments according to the present invention will be described in detail in the following with reference to the accompanying drawings.

<First Embodiment>

A wafer having a ring-shaped stiffening portion at the periphery of the wafer as shown in FIGS. 12A through 12D can be formed by a process as shown in FIGS. 13A, 13B, and FIGS. 14A, 14B, and 14C. Descriptions on the FIGS. 12A through 12D and FIGS. 13A, 13B, and FIGS. 14A, 14B, and 14C have been made in the foregoing and are not repeated here.

FIGS. 1A, 1B, FIGS. 2A, 2B, FIGS. 3A, 3B, FIGS. 4A, 4B, 4C, and FIGS. 5A, 5B illustrates the first embodiment according to the present invention. Of the figures, FIGS. 4A, 4B, and 4C are timing charts showing pressures on some parts in the embodiment.

Figure 1A:
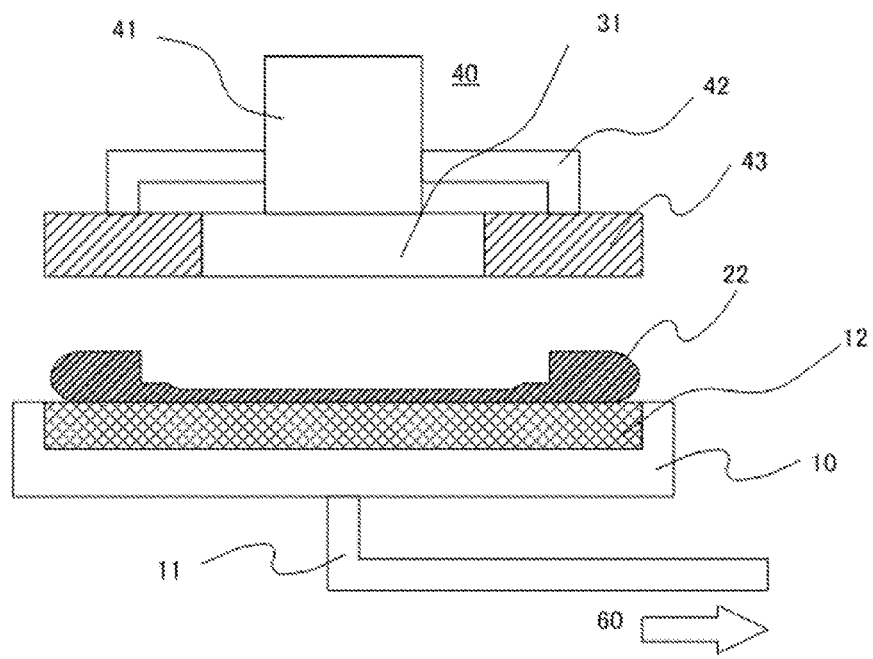
FIGS. 1A and 1B show a first embodiment according to the present invention.

FIG. 1A shows a wafer 22 attached by suction on the surface of an attachment plate 12 of a chuck table 10. The attachment plate 12 is made of a porous material and has a surface machined to be flat for attaching the wafer 22. The chuck table 10 is connected to a vacuum system (not depicted) through a supply and exhaust path 11. A negative pressure (indicated by the symbol 60) supplied by the vacuum system is transmitted to the surface of the attachment plate 12 and attracts the wafer 22 through vacuum suction. FIG. 1A shows the wafer 22 after completion of a grinding step as illustrated in FIGS. 12A through 12D, FIGS. 13A, 13B, and FIGS. 14A, 14B, and 14C.

The following describes a procedure of transferring the wafer 22 to the next step according to the sequence of the procedure.

FIG. 1A shows a transport device 40 that is standing by above the wafer 22 after completion of the grinding step. The transport device 40 comprises an attracting mechanism 30 (indicated in FIG. 2B), which is a pick up device, and a pressing device including a pressing pad 43, a pressing pad support arm 42, and a pressing pad sliding member 41.

The pressing pad 43, which is a stiffening portion pressing mechanism, presses the ring-shaped stiffening portion of the wafer 22. The pressing pad supporting arm 42 supports the pressing pad 43 and is fixed to a pressing pad sliding member 41 such that the pressing pad 43 is allowed to be vertically moved independently of the attracting mechanism 30.

Figure 14A:
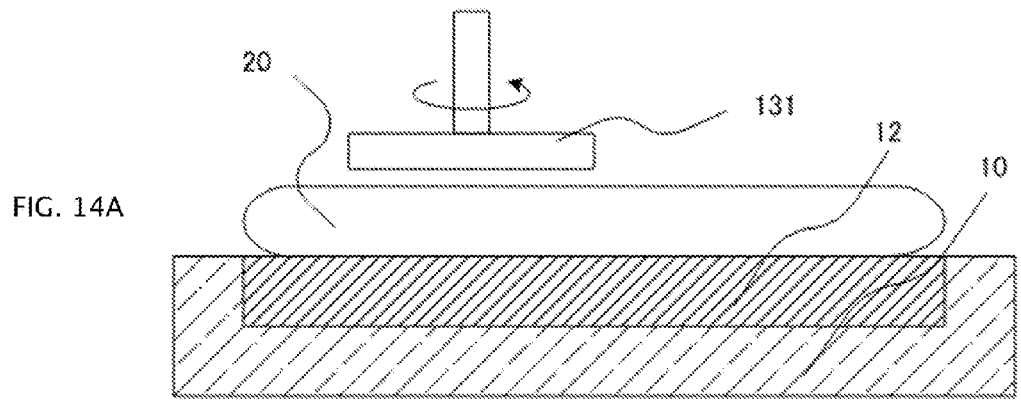
FIGS. 14A, 14B, and 14C show a manufacturing process of a wafer having a ring-shaped stiffening portion.
Figure 14B:
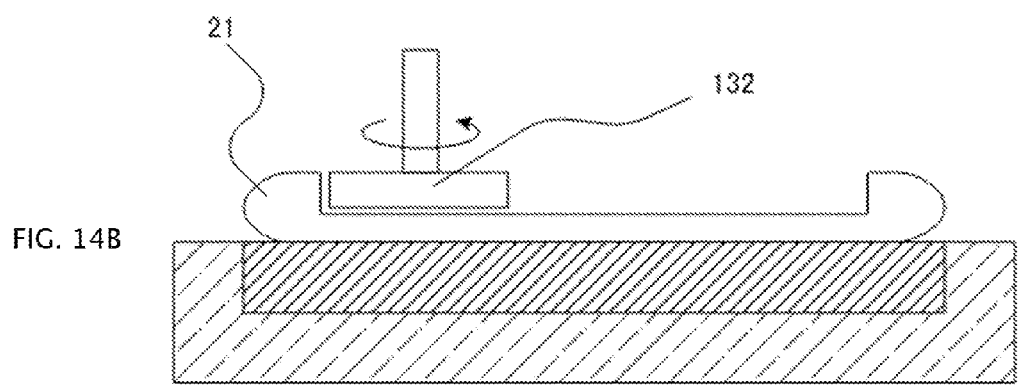
Figure 14C:
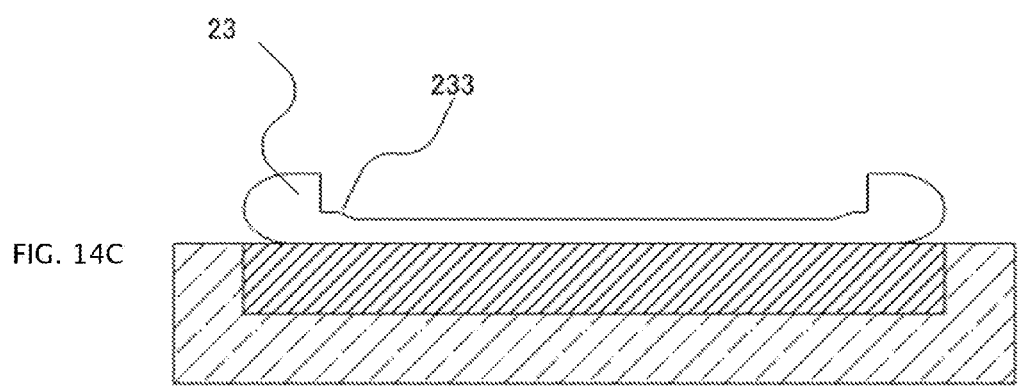

The pressing pad 43 is made of an elastic material in this embodiment example. A material for the pressing pad 43, although not limited to an elastic material, preferably exhibits such elastic deformability that follows the configuration of the ring-shaped stiffening portion of the wafer 22 and such rigidity that withstands blowing up of air or the like through the attachment plate 12, the blowing up being described afterwards. The favorable materials include foamed resin such as EVA resin and silicone rubber. The pressing pad 43 has a shape of a ring with a width wider than that of the ring-shaped stiffening portion of the wafer 22 and projects out toward both the inside and outside so as to cover whole the width of the stiffening portion. The pressing pad 43 has preferably such a width that projects out toward both inside and outside from the position of the ring-shaped stiffening portion by a dimension larger than 1 mm. The dimension of the pressing pad 43 covers the ring-shaped stiffening portion without failure irrespective of some positional deviation of the pressing pad 43. The inside portion of the pressing pad 43 covers at least an inside wall of the recessed portion of the wafer 22. In addition, in the case the wafer 22, like the one illustrated in FIG. 1A, has been ground through two stages as illustrated in FIGS. 14A, 14B, and 14C, the pressing pad 43 preferably covers the step part generated in the second grinding step.

Figure 2A:
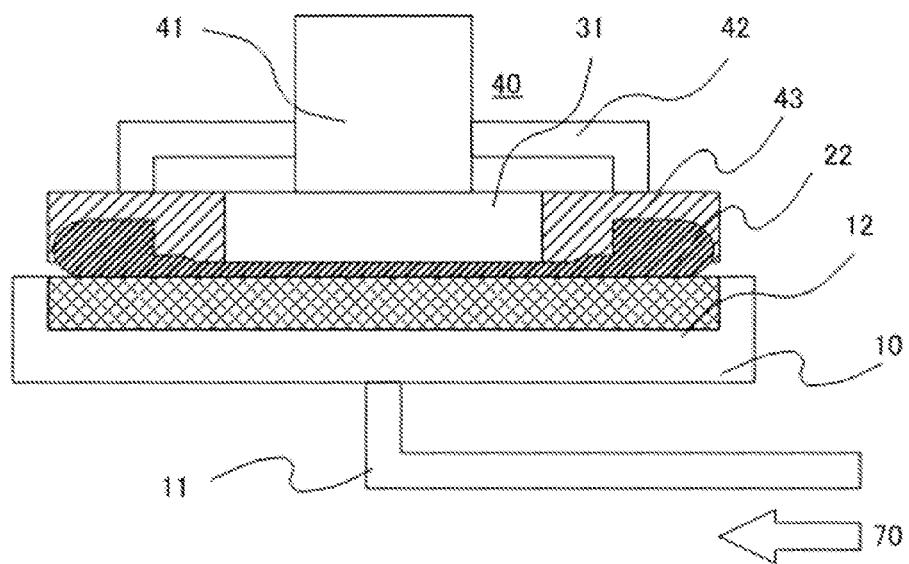
FIGS. 2A and 2B show the first embodiment according to the present invention in the states following those in FIGS. 1A and 1B.
Figure 2B:
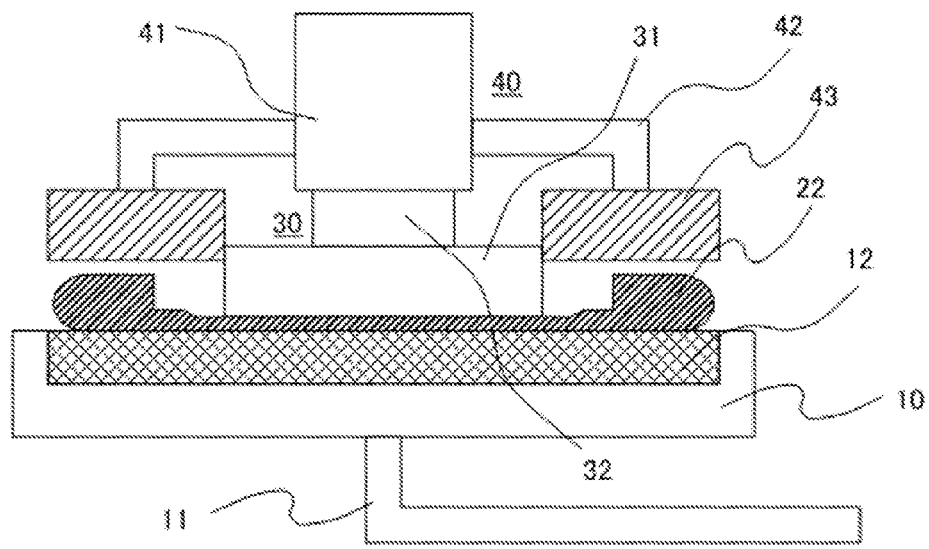

An attracting member 31 shown in FIG. 1A of the attracting mechanism 30 indicated in FIG. 2B is fixed to a support member 32 (indicated in FIG. 2B) and vertically movable independently of the pressing pad 43. The support member 32 includes an exhausting path (not depicted) communicating with a lower surface of the attracting member 31. The exhausting path is connected to a vacuum system (not depicted) and supplies negative pressure to attract and hold the wafer 22 on the surface of the attracting member 31.

Figure 1B:
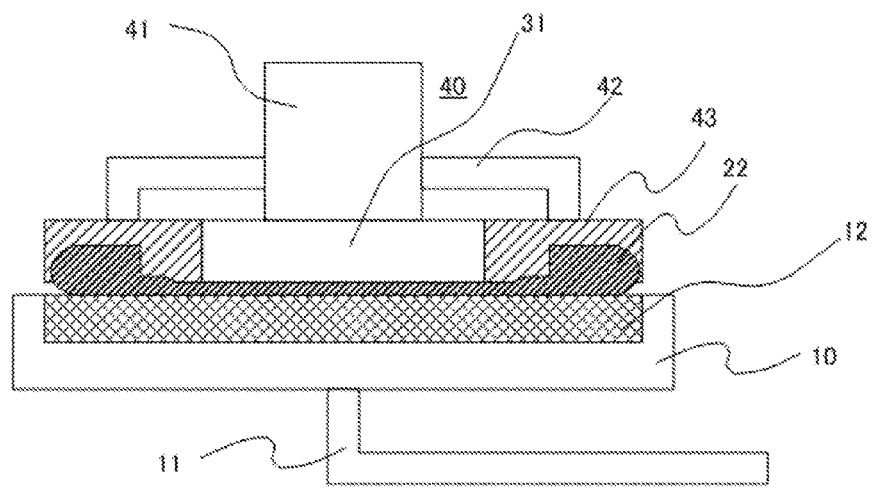

In the embodiment example shown in FIG. 1A, the contact surface with the wafer 22 of the attracting member 31 of the attracting mechanism 30 is in a common plane with the contact surface with the wafer 22 of the pressing pad 43. Then, the attracting member 31 and the pressing pad 43 are lowered as shown in FIG. 1B until the attracting member 31 comes in contact with the thin portion of the wafer 22 and the pressing pad 43 is pushed against the ring-shaped stiffening portion of the wafer 22 and elastically deformed. The attracting member 31 and the pressing pad 43 in the above description are simultaneously lowered. However, another procedure is also possible in which one of the two members is lowered in advance and the other follows.

FIG. 4A shows the pressure exerted on the wafer 22 placed on the attachment plate 12 of the chuck table 10; FIG. 4B shows the pressure exerted on the wafer 22 from the attracting member 31; and FIG. 4C shows the pressure exerted on the wafer 22 by the pressing pad 43.

The state illustrated in FIG. 1B is the one at the time t1 in FIGS. 4A, 4B, and 4C. A negative pressure has been supplied to the surface of the attachment plate 12 of the chuck table 10 as shown in FIG. 4A. The attracting member 31 has been lowered from the position in FIG. 1A and reached the position of the wafer 22 but does not yet supply negative pressure for attracting the wafer 22 as shown in FIG. 4B. The pressing pad 43, after reaching the ring-shaped stiffening portion of the wafer 22, is further pushed down with elastic deformation of the pressing pad itself until the time t1 at which the pressure on the ring-shaped stiffening portion attains a predetermined value.

Then, the procedure advances to the state shown in FIG. 2A. In the state of FIG. 2A, the supply of negative pressure through the supply and exhaust path 11 has been stopped, and supply of positive pressure (indicated by the symbol 70) starts on the surface of the attachment plate 12 of the chuck table 10 from a positive pressure supplying system (not depicted) in order to facilitate removal of the wafer 22 from the chuck table 10. The positive pressure is given by supplying water, air, or a mixture of water and air through the supply and exhaust path 11 and attains a predetermined value at the time t2.

Figure 15A:
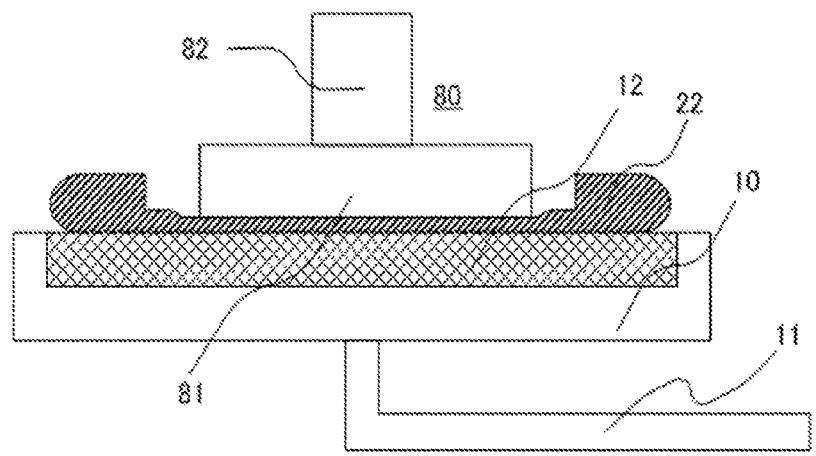
FIGS. 15A, 15B, and 15C show a conventional transport device.
Figure 15B:
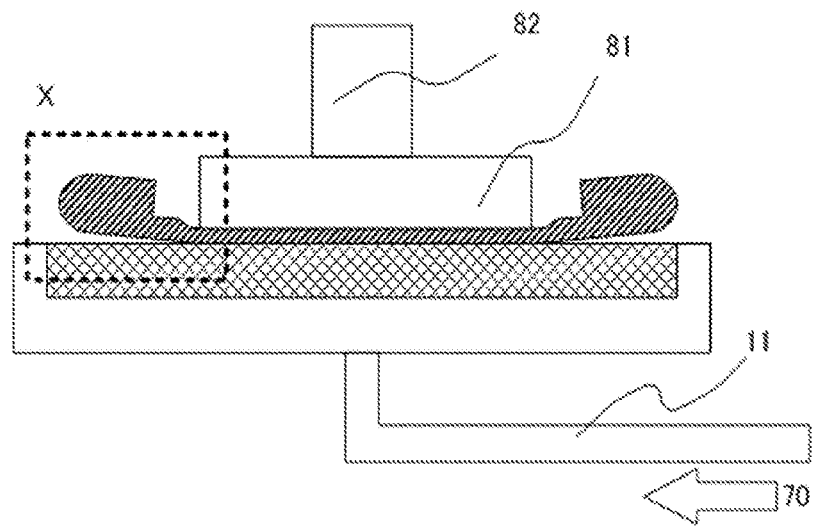
Figure 15C:
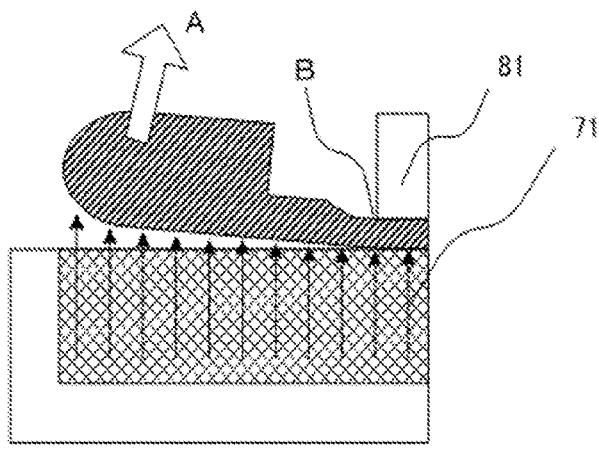

Since the ring-shaped stiffening portion including the vicinity thereof is pushed toward the attachment plate 12 of the chuck table 10 by the pressing pad 43, blowing out of water, air, or a mixture of water and air through the attachment plate 12 is suppressed to prevent the peripheral region from locally floating up like shown in FIG. 15C. Since the local floating up does not occur, no stress concentration takes place at the places of remaining damages generated in the grinding step or the places of varying curvature. Thus, the wafer 22 does not suffer from any breakage such as cracks upon application of the positive pressure on the surface of the attachment plate 12.

The application of positive pressure 70 is stopped at the time t3 after continued application for a predetermined period of time.

Then, the procedure advances to the state shown in FIG. 2B. After stopping the application of positive pressure 70, the pressing pad sliding member 41 alone is elevated at the time t4. The support member 32 as well as the attracting member 31 does not move. The pressure exerted by the pressing pad 43 decreases in the process of elevating the pressing pad sliding member 41 and eventually becomes null when the pressing pad 43 departs from the ring-shaped stiffening portion of the wafer 22.

Subsequently at the time t5, the attracting member 31 is supplied with a negative pressure through the exhausting path (not depicted) in the support member 32 to attract the thin portion of the wafer 22.

Figure 3A:
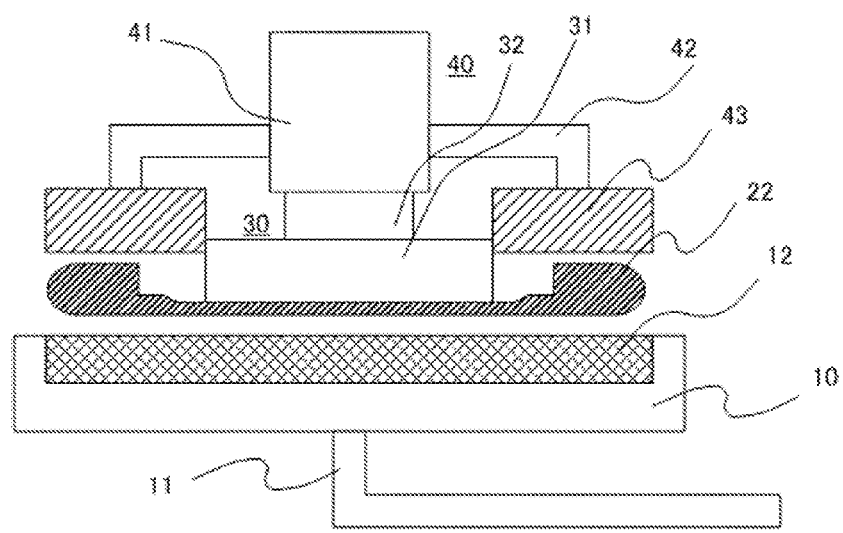
FIGS. 3A and 3B show the first embodiment according to the present invention in the states following those in FIGS. 2A and 2B.

At this moment of t5, as explained previously with reference to FIG. 2A, adhesion between the wafer 22 and the attachment plate 12 has been released by application of positive pressure 70 in the period from t2 to t3. Therefore, after attracting the wafer 22 by the attracting member 31, the wafer 22 can easily be picked up from the chuck table 10 by elevating the attracting member 31 as shown in FIG. 3A. The attracting member 31 is elevated by elevating the support member 32 to which the attracting member 31 is fixed.

Figure 3B:
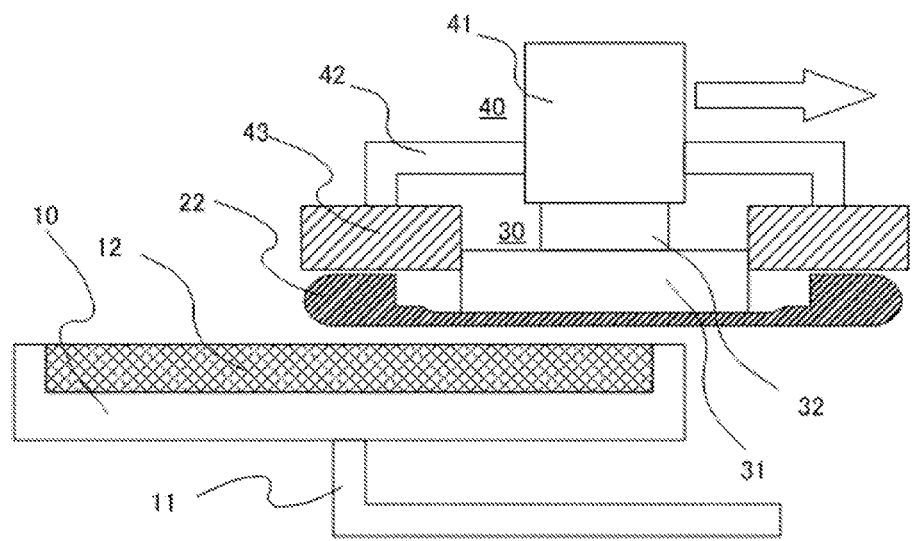

Subsequently, the transport device 40 is moved in the horizontal direction with the attracting member 31 attracting the wafer 22 as shown in FIG. 3B.

The embodiment described above allows the adhesion of the wafer 22 on the chuck table 10 to be quickly released. The time duration from t2 to t3 in FIGS. 4A, 4B, and 4C is about three seconds, for example, whereas it took conventionally about ten minutes for the adhesion to be released naturally (without adding any action for fast release) in order to avoid any damage on the wafer. Thus, substantial reduction of time has been achieved. The wafer is picked up without any damage and transferred to the next step.

Figure 5A:
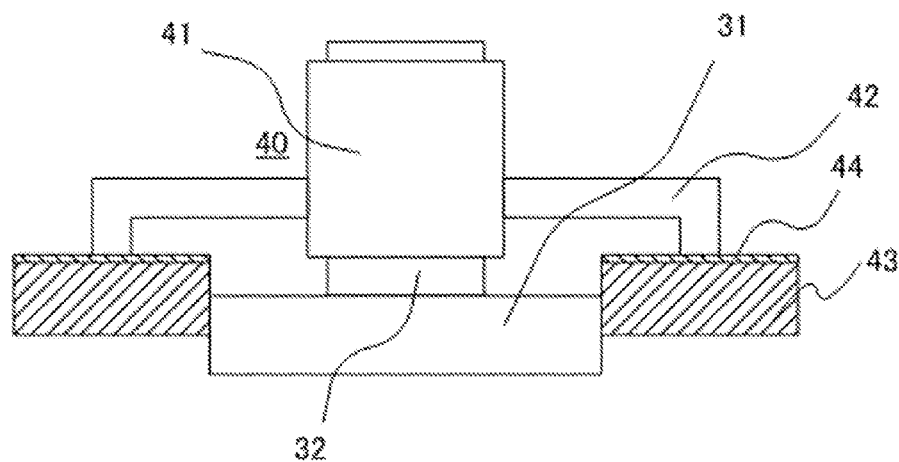
Figure 5B:
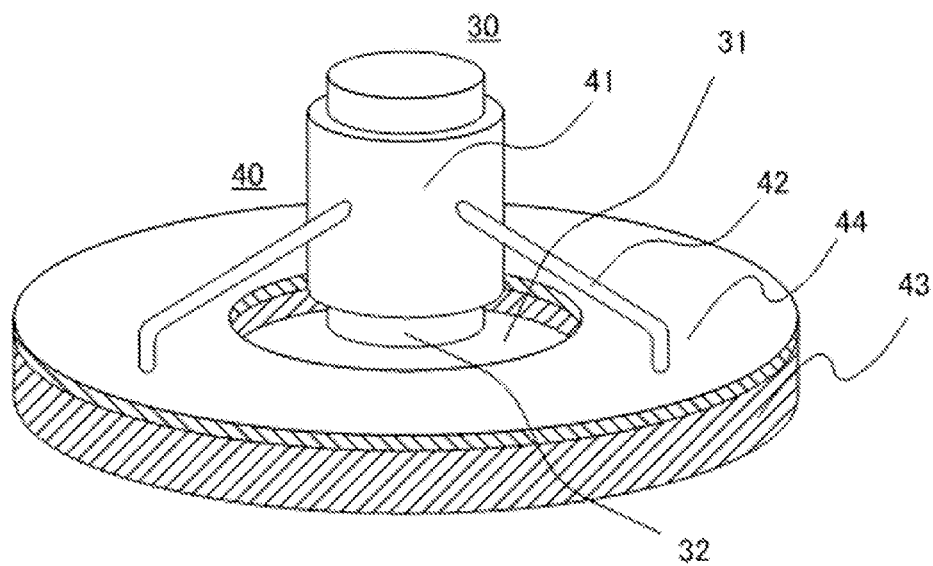

FIGS. 5A and 5B show essential part of the transport device 40, in which FIG. 5A is a sectional view and FIG. 5B is a perspective view. The attracting member 31 is fixed to the support member 32. The support member 32 includes an exhaust path for supplying negative pressure at the surface of the attracting member 31 from a vacuum system (not depicted). The pressing pad sliding member 41 is disposed around the support member 32 so as to vertically move independently of the support member 32. The pressing pad sliding member 41 is driven vertically by the power from a driving system (not depicted). FIGS. 5A and 5B show the state in which the pressing pad sliding member 41 has been elevated to such a position that the contact plane of the pressing pad 43 to the wafer 22 is higher than the attracting surface of the attracting member 31. The support member 32 and the pressing pad sliding member 41 are constructed coaxially, and the transport device 40 moves as a monolithic body combining the attracting member 31 and the pressing pad 43 in the vertical movement above the wafer 22 and the chuck table 10 and in the horizontal movement from a position above the chuck table 10 to a horizontally different position.

FIGS. 5A and 5B shows a pressing pad support plate 44. Although the construction can be used in which the pressing pad 43 is directly supported by the pressing pad support arm 42 as shown in FIGS. 1A through 3B, another construction can also be employed in which the pressing pad 43 is fixed to the pressing pad support plate 44 that is fixed to the pressing pad support arm 42 as shown in FIGS. 5A and 5B. The pressing pad support plate 44 has a configuration that does not obstruct vertical movement of the pressing pad 43 due to the attracting member 31 and is an annular disk, for example, as shown in FIG. 5B. The use of the pressing pad support plate 44 for supporting the pressing pad 43 securely holds the pressing pad 43 made of an elastic material such as a foamed resin and applies uniform pressure on the wafer 22.

Figure 6A:
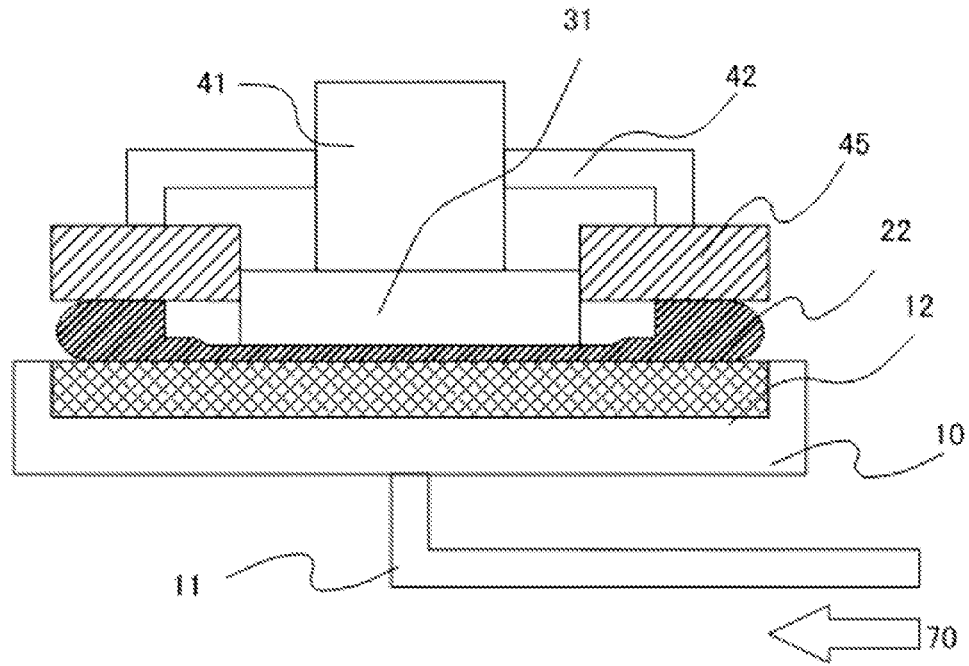
FIGS. 6A and 6B show modifications of the transport device in the first embodiment according to the present invention.
Figure 6B:
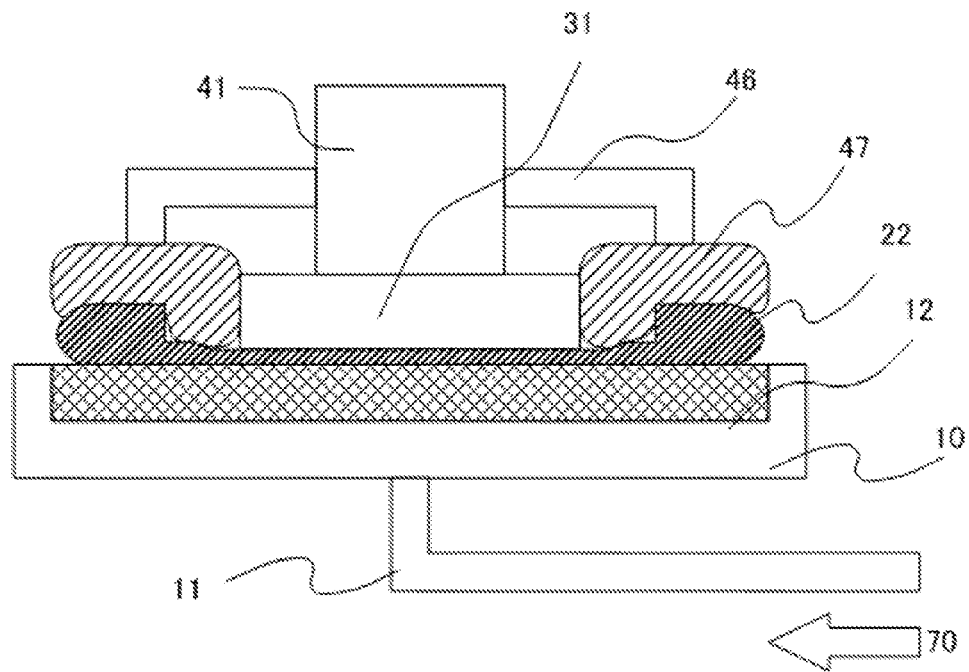

FIGS. 6A and 6B shows a modification in the first embodiment according to the invention.

In the device of FIG. 6A, the pressing pad 43 made of an elastic material provided in the transport device 40 shown in FIG. 1A is replaced by a pressing member 45 made of a material less deformable elastically. The pressing member 45 can be made of an engineering plastic such as polycarbonate, polyamide, etc.

The pressing member 45, being made of an elastically less deformable material, does not deform following the shape of the ring-shaped stiffening portion. However, the ring-shaped stiffening portion, being pushed toward the chuck table by the pressing member 45, does not locally float up by blowing up of water, air, or a mixture of water and air through the attachment plate 12 like in a configuration shown in FIG. 15C.

The pressing member 45, having certain rigidity by itself, can be readily attached to the pressing pad support arm 42.

In the device of FIG. 6B, the pressing pad 43 made of an elastic material provided in the transport device 40 shown in FIG. 1A is replaced by a hollow pressing tube 47. The pressing tube 47 is a ring-shaped tube made of an elastic material such as rubber containing air or the like in the hollow thereof. Like the pressing pad 43 shown in FIG. 1B, the pressing tube 47 elastically deforms upon pressing against the ring-shaped stiffening portion following the shape of the stiffening portion as shown in FIG. 6B.

The pressing tube 47 is attached, with air or the like filling the hollow thereof, to the pressing pad support arm 42. Alternatively, the pressing tube 47 can be attached to, in place of the pressing pad support arm 42, a pressing tube support arm 46 provided with a supply and exhaust path to the pressing tube 47.

The ring-shaped stiffening portion, being pushed toward the chuck table by the pressing tube 47, does not locally float up by blowing up of water, air, or a mixture of water and air through the attachment plate 12 like in a configuration shown in FIG. 15C.

The use of the pressing tube support arm 46 controls the pressure in the tube, thereby adjusting degree of deformation of the tube following the configuration of the stiffening portion and the pushing force on the stiffening portion.

<Second Embodiment>

The second embodiment according to the present invention will be described in the following with reference to FIGS. 7A, 7B, FIGS. 8A, 8B, FIGS. 9A, 9B, and FIGS. 10A, 10B, and 10C.

FIGS. 7A, 7B, FIGS. 8A, 8B, FIGS. 9A, 9B, and FIGS. 10A, 10B, and 10C illustrate the second aspect of embodiment according to the present invention. Of these figures, FIGS. 10A, 10B, and 10C are timing charts showing pressure at some parts in the device of the embodiment.

Figure 7A:
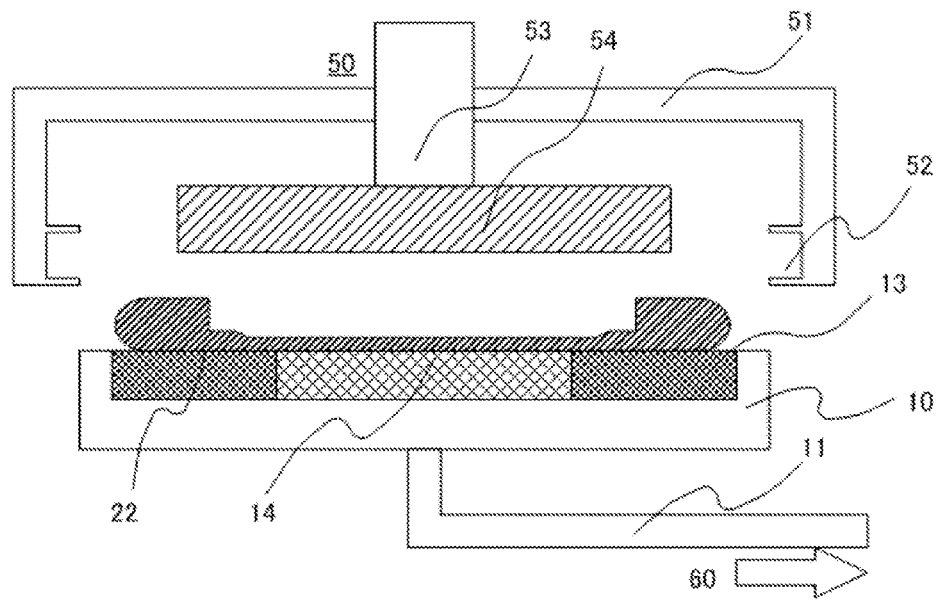
FIGS. 7A and 7B show a second embodiment according to the present invention.

FIG. 7A shows a wafer 22 attached by suction on the surfaces of attachment plates 13 and 14 of a chuck table 10. The attachment plates 13 and 14 are made of a porous material and have a surface machined to be flat for attaching the wafer 22. The attachment plate 13 to attach the outer peripheral portion of the wafer 22 is made of a relatively high density porous material and has a structure that effectively transmits a negative pressure from a supply and exhaust path 11 to the attracted surface of the wafer 22. Because of the relatively high density porous material, the attachment plate 13 performs just minimum leakage of atmosphere to the supply and exhaust path 11 for vacuum suction even though the outer peripheral part of the attachment plate 13, the outer peripheral part being not covered with and not in contact with the wafer 22, is exposed to the atmosphere.

The attachment plate 14 to attach by suction the central portion of the wafer 22 is made of a relatively low density porous material and has a structure that effectively transmits a negative pressure from a supply and exhaust path 11 to the attracted surface of the wafer 22.

The chuck table 10 is connected to a vacuum system (not depicted) through the supply and exhaust path 11. A negative pressure (indicated by the symbol 60) supplied by the vacuum system is transmitted to the surface of the attachment plates 13 and 14 and attracts the wafer 22 through vacuum suction. FIG. 7A shows the wafer 22 after completion of a grinding step as illustrated in FIGS. 12A through 12D, FIGS. 13A, 13B, and FIGS. 14A, 14B, and 14C.

The following describes a procedure of transferring the wafer 22 to the next step according to the sequence of the procedure.

FIG. 7A shows a transport device 50 that is standing by above the wafer 22 after completion of the grinding step. The transport device 50 comprises: a holding member 52 which is a holding mechanism for holding the ring-shaped stiffening portion of the wafer 22 at the outermost peripheral portion thereof; a support arm 51 for supporting the holding member 52; a pressing pad 54 which is a inner region pressing mechanism for pressing the thin portion of the wafer 22 and vertically moves independently of the holding member 52; and a support member 53 for supporting the pressing pad 54. The pressing pad 54 presses the thin central portion (inner region) of the wafer 22. The pressing pad 54 in this embodiment example is made of an elastic material. A material for the pressing pad 54, although not limited to an elastic material, preferably exhibits such elastic deformability that follows the configuration of the ring-shaped stiffening portion of the wafer 22 and such rigidity that withstands blowing up of air or the like through the attachment plates 13 and 14, the blowing up being described afterwards. The favorable materials include formed resin such as EVA resin and silicone rubber.

Figure 16A:
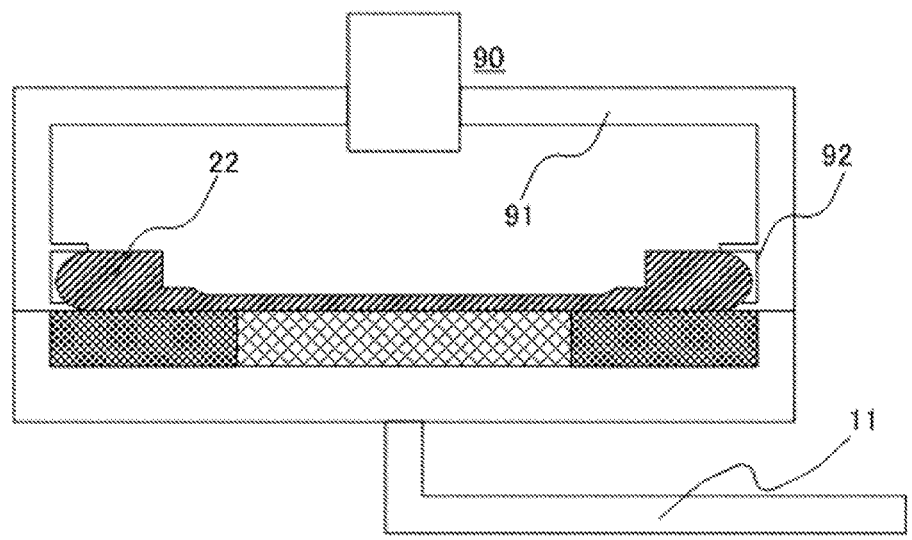
FIGS. 16A and 16B show a conventional transport device.
Figure 16B:
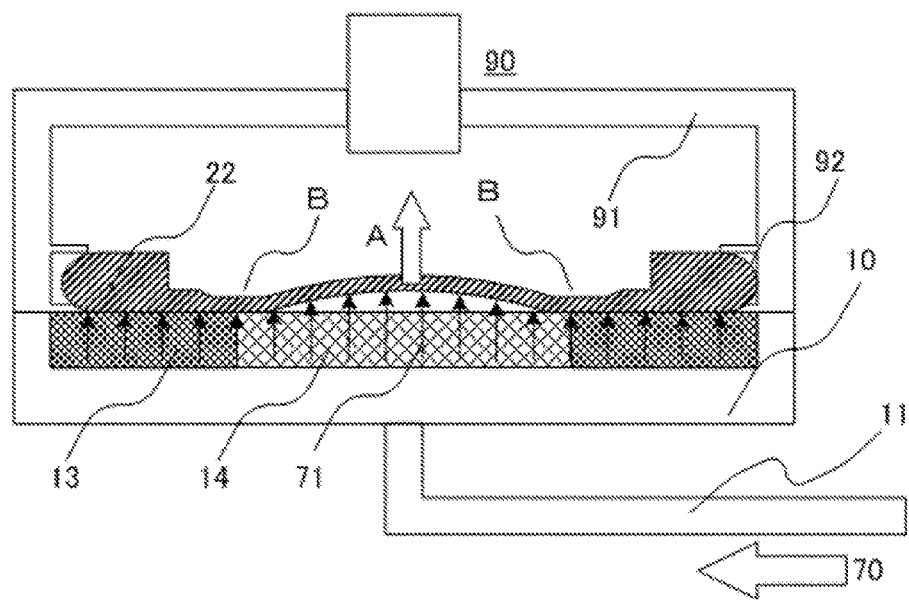

The pressing pad 54 has a shape of a disk covering the thin recessed portion and the inside portion of the ring-shaped stiffening portion. The pressing pad 54 has a dimension that is a little larger than that of the thin recessed portion and able to cover the inside portion of the ring-shaped stiffening portion. The diameter of the pressing pad 54 is preferably about 1 mm larger than that of the inner circumferential edge of the ring-shaped stiffening portion. The dimension of the pressing pad 54 covers the stepped part at the inner circumferential end of the ring-shaped stiffening portion without failure irrespective of some positional deviation of the pressing pad 54. The pressing pad 54 preferably covers the outer side wall of the thin recessed portion (or the inner circumferential side wall of the ring-shaped stiffening portion). However, the pressing pad 54 that presses at least the thin recessed portion can suppress the local floating up as shown in FIG. 16B.

In addition, in the case the wafer 22, like the one illustrated in FIG. 7A, has been ground through two stages as illustrated in FIGS. 14A, 14B, and 14C, the pressing pad 54 preferably covers the step part generated in the second grinding step.

The holding member 52 stands by at the position outer than the outer periphery of the wafer 22 as shown in FIG. 7A and is vertically movable independently of the pressing pad 54 fixed to the support member 53. The pressing pad 54 stands by above the wafer 22 in the example shown in FIG. 7A.

Figure 7B:
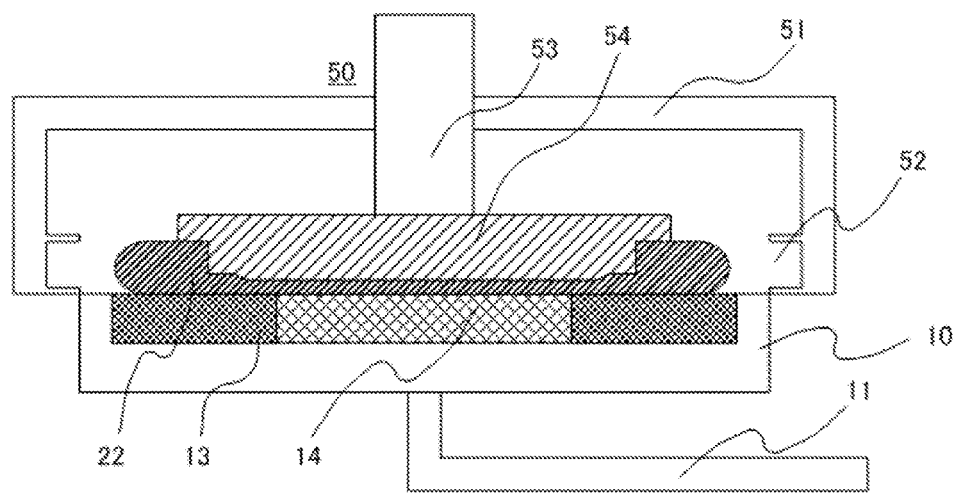

Then, the holding member 52 and the pressing pad 54 are lowered as shown in FIG. 7B until the pressing pad 54 comes in contact with the thin recessed portion of the wafer 22 and presses the wafer 22 with elastic deformation of the pressing pad 54. The holding member 52 and the pressing pad 54 in the above description are simultaneously lowered. However, another procedure is possible as well in which one of the two members is lowered in advance and the other follows.

FIG. 10A shows the pressure exerted on the wafer 22 put on the surface of the attachment plate of the chuck table 10. FIG. 10B shows the force exerted by the holding member 52 to hold the wafer 22 at the outer peripheral part thereof (which is the ring-shaped stiffening portion). FIG. 10C shows the pressure exerted on the wafer 22 by the pressing pad 54.

The state illustrated in FIG. 7B is the one at the time t1 in FIGS. 10A, 10B, and 10C. A negative pressure is supplied to the surface of the attachment plates 13 and 14 of the chuck table 10 as shown in FIG. 10A. The holding member 52 has been lowered from the position in FIG. 7A and arrived at the same level as of the wafer 22 but has not yet moved to the position of holding the wafer 22. The pressing pad 54, after reaching the thinned recessed portion of the wafer 22, is further pushed down with elastic deformation of the pressing pad itself until the time t1 at which the pressing pad 54 presses the thin recessed portion and a part of the ring-shaped stiffening portion with a predetermined pressure.

Figure 8A:
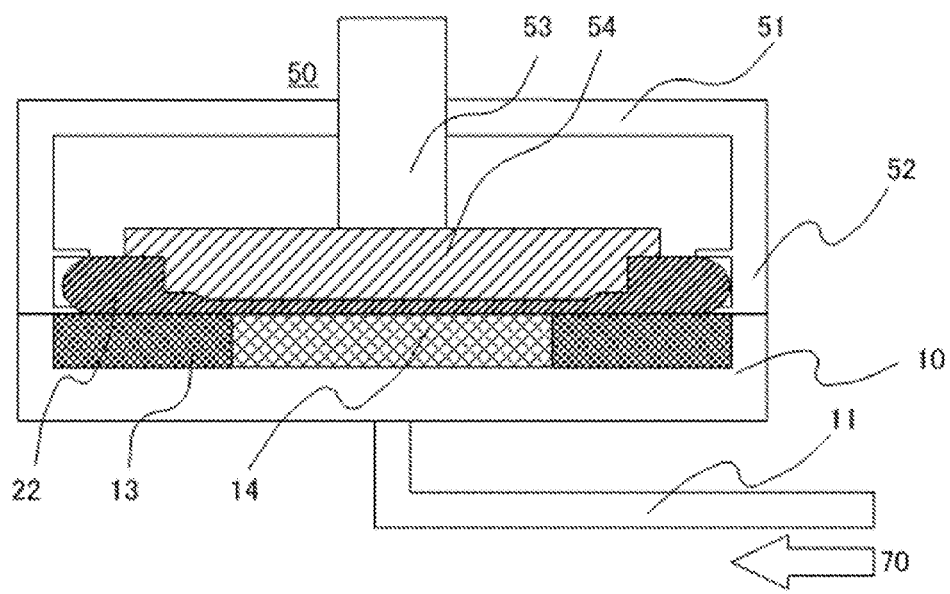
FIGS. 8A and 8B show the second embodiment according to the present invention in the states following those in FIGS. 7A and 7B.

Then, the procedure advances to the state shown in FIG. 8A. In the state of FIG. 8A, the holding member 52 approaches the wafer 22 from the outside of the wafer and holds the ring-shaped stiffening portion. The holding member 52 in this example has a construction to hold both the upper and lower surfaces of the ring-shaped stiffening portion as shown in FIG. 8A. Holding the upper surface of the ring-shaped stiffening portion suppresses floating up of the outer peripheral portion of the wafer 22 due to blowing up of water, air, and the like. Holding the lower surface of the ring-shaped stiffening portion facilitates picking up of the wafer 22 in a later step.

Then, the supply of the negative pressure through the supply and exhaust path 11 is stopped, and supply of positive pressure (indicated by the symbol 70) starts on the surface of the attachment plates 13 and 14 of the chuck table 10 at the time t2 indicated in FIGS. 10A, 10B, and 10C in order to facilitate removal of the wafer 22 from the chuck table 10. The positive pressure is given by supplying water, air, or a mixture of water and air through the supply and exhaust path 11.

In this state, the pressing pad 54 presses the thin recessed portion, the boundary region between the thin recessed portion and the ring-shaped stiffening portion, and a part of the ring-shaped stiffening portion of the wafer 22 toward the chuck table 10. Therefore, blowing out of water, air, or a mixture of water and air through the attachment plates 13 and 14 is suppressed to avoid the local floating up as shown in FIG. 16B. Since the local floating up does not occur, no stress concentration takes place at the places of remaining damages generated in the grinding step or the places of varying curvature. Thus, the wafer 22 does not suffer from any breakage such as cracks upon application of the positive pressure on the surface of the attachment plates 13 and 14. After applying the positive pressure 70 for a predetermined period of time, the application of the positive pressure 70 is stopped at the time t3 indicated in FIGS. 10A, 10B, and 10C.

Figure 8B:
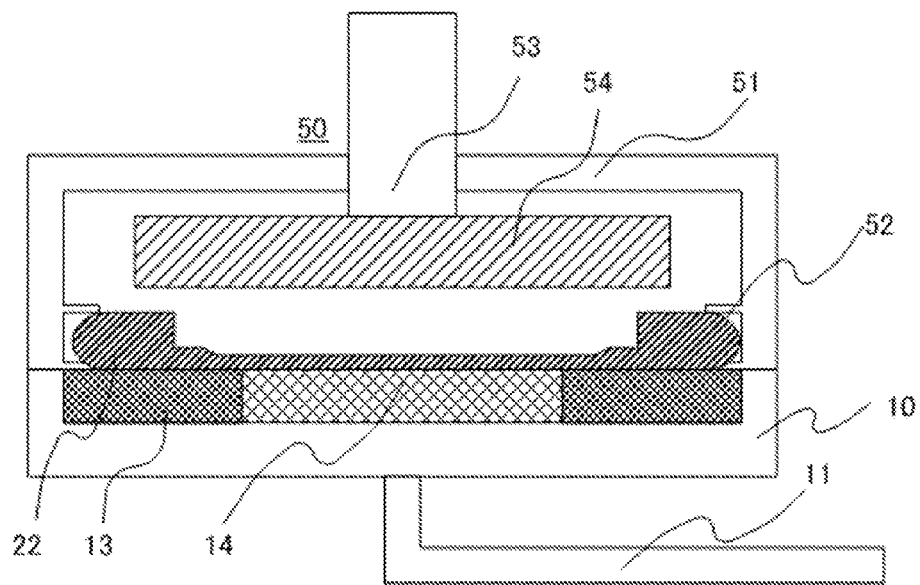

Then, the procedure advances to the state shown in FIG. 8B. After stopping the application of the positive pressure 70, the pressing pad 54 alone is elevated at the time t4 indicated in FIGS. 10A, 10B, and 10C. The holding member 52 is not moved. The pressure exerted by the pressing pad 54 decreases in the process of elevating the pressing pad 54 and ultimately becomes null when the pressing pad 54 departs from the wafer 22.

Figure 9A:
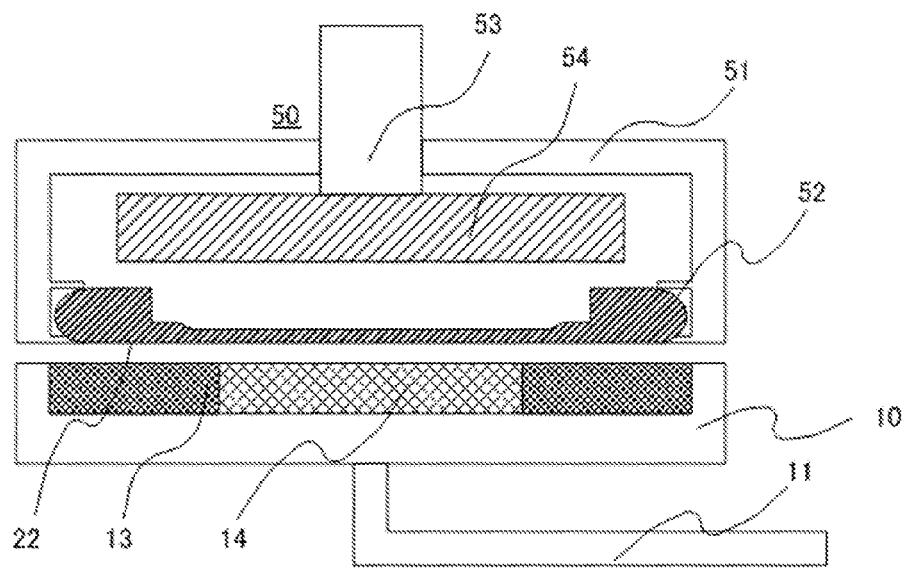
FIGS. 9A and 9B show the second embodiment according to the present invention in the states following those in FIGS. 8A and 8B.

In this process, the adhesion of the wafer 22 onto the attachment plates 13 and 14 has been released by the application of the positive pressure 70 on the attachment plates 13 and 14 during the period from the time t2 to the time t3. The outer peripheral portion (or the ring-shaped stiffening portion) of the wafer 22 is held by the holding member 52. Consequently, in the next step, the wafer can be readily picked up from the chuck table 10 by elevating the holding member 52 as shown in FIG. 9A. The holding member 52 is elevated together with the support member 53 that fixes the pressing pad 54. Accordingly, the pressing pad 54 does not become in contact with the wafer 22.

Figure 9B:
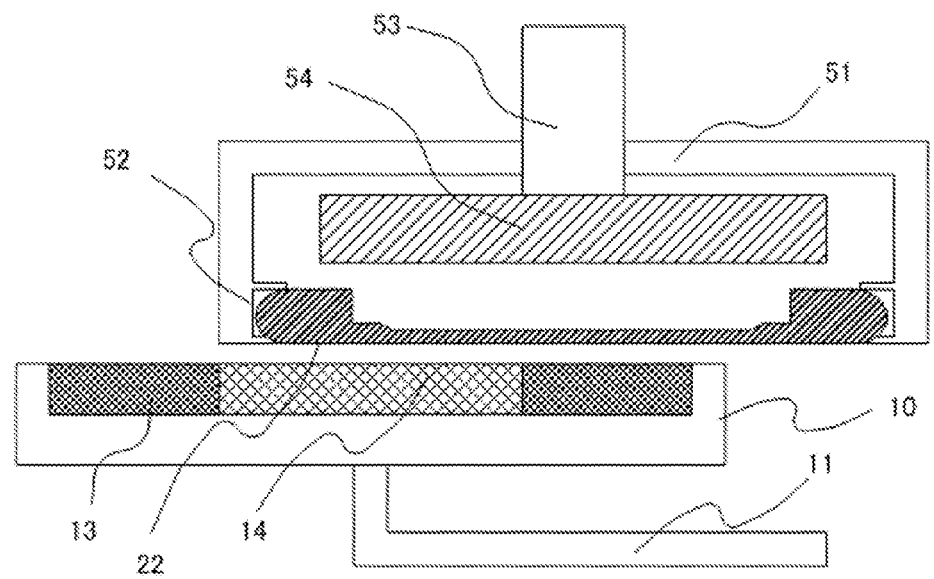

Subsequently, the transport device 50 starts to move horizontally with the holding member 52 holding the outer peripheral portion (or the ring-shaped stiffening portion) of the wafer 22 as shown in FIG. 9B.

The embodiment described above allows the adhesion of the wafer 22 onto the chuck table 10 to be quickly released. The time duration from t2 to t3 in FIGS. 10A, 10B, and 10C is about three seconds, for example, whereas it took conventionally about ten seconds for the adhesion to be released naturally (without adding any action for fast release) in order to avoid any damage on the wafer. Thus, substantial reduction of time has been achieved. The wafer is picked up without any damage and transferred to the next step.

Although not shown in the figures, the pressing pad 54 illustrated in FIG. 7A can be fixed to a pressing pad support plate that is additionally provided like in the construction illustrated in FIGS. 5A and 5B. The pressing pad support plate has a configuration that does not interfere with vertical movement of the pressing pad 54 due to the holding member 52. The use of the pressing pad support plate for supporting the pressing pad 54 securely holds the pressing pad 54 made of an elastic material such as a foamed resin and applies uniform pressure on the wafer 22.

Figure 11A:
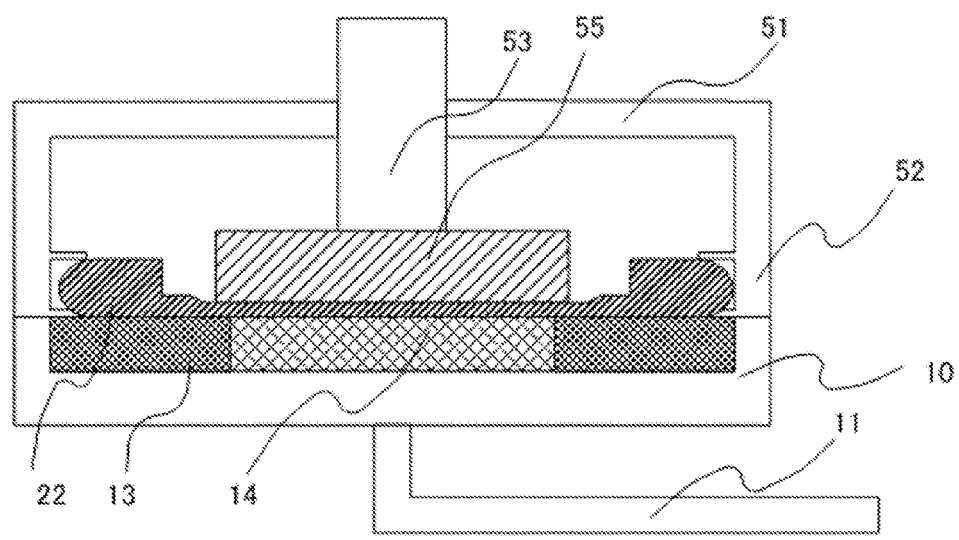
FIGS. 11A and 11B show modifications of the transport device in the second embodiment according to the present invention.
Figure 11B:
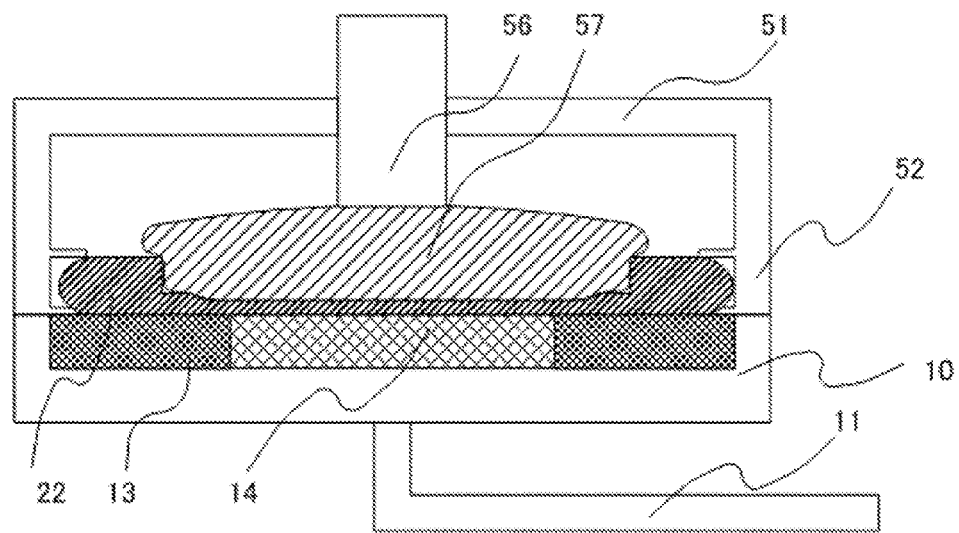
Figure 12A:
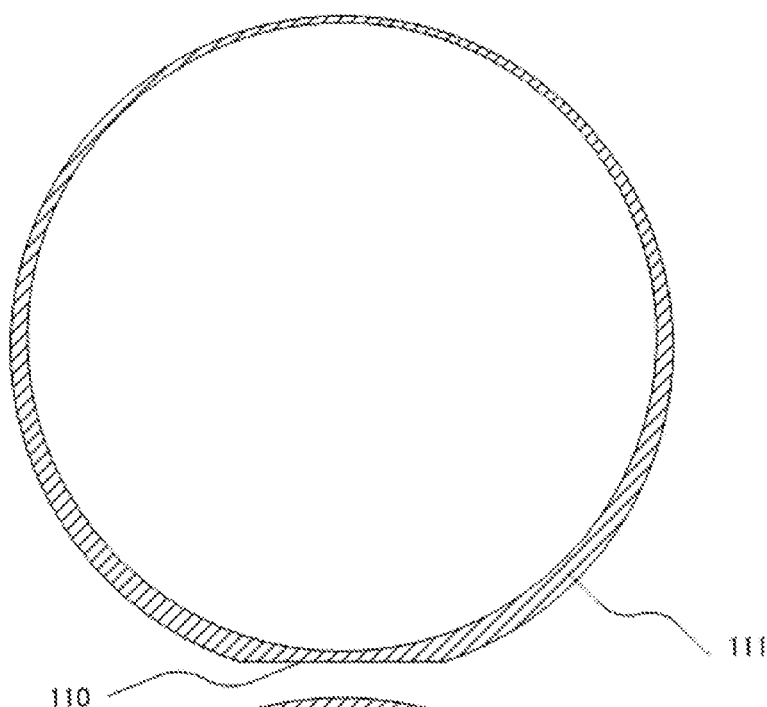
FIGS. 12A, 12B, 12C, and 12D show wafers having a ring-shaped stiffening portion.
Figure 12B:
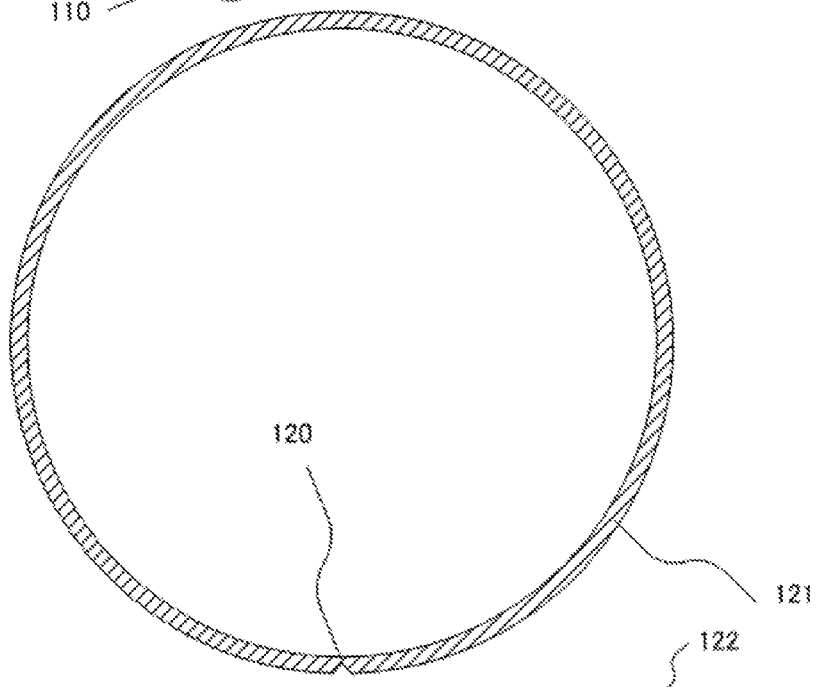
Figure 12C:
Figure 12D:
Figure 13A:
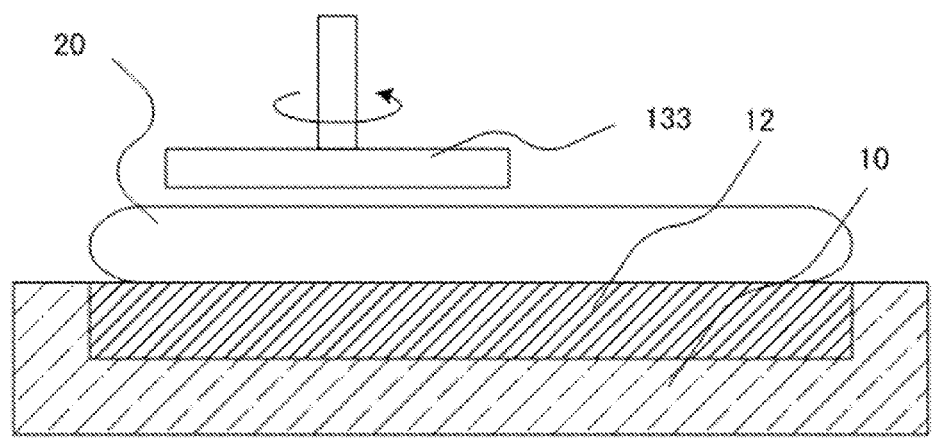
FIGS. 13A and 13B show a manufacturing process of a wafer having a ring-shaped stiffening portion.
Figure 13B:
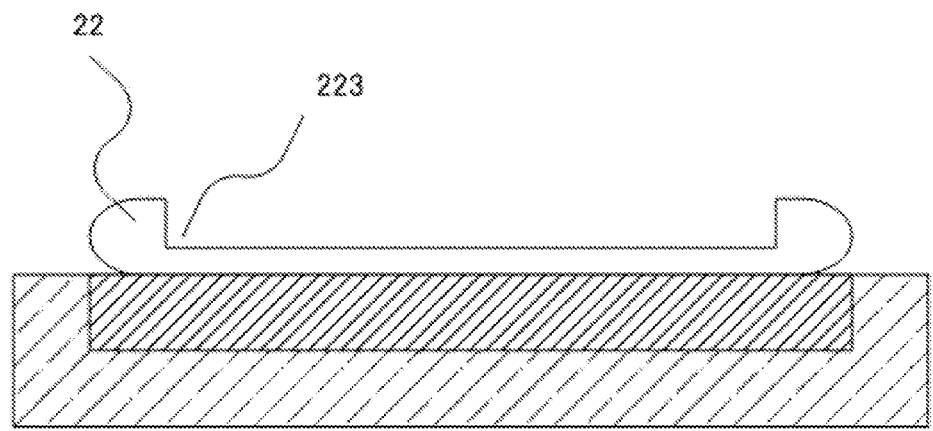

FIGS. 11A and 11B shows a modification in the second embodiment according to the invention.

In the device of FIG. 11A, the pressing pad 54 made of an elastic material provided in the transport device 50 shown in FIG. 7A is replaced by a pressing member 55 made of a material less deformable elastically. The pressing member 55 can be made of an engineering plastic such as polycarbonate, polyamide, etc.

The pressing member 55 is made in contact solely with the thin recessed portion of the wafer 22. This is because the pressing member 55, being made of an elastically less deformable material, does not deform following the shape of the ring-shaped stiffening portion. However, the thin recessed portion of the wafer 22, being pushed toward the chuck table 10 by the pressing member 55, does not locally float up by blowing up of water, air, or a mixture of water and air through the attachment plate 14 like in a configuration shown in FIG. 16B.

The pressing member 55, having certain rigidity by itself, can be readily attached to the support member 53.

In the device of FIG. 11B, the pressing pad 54 made of an elastic material provided in the transport device 50 shown in FIG. 7A is replaced by a hollow pressing balloon 57. The pressing balloon 57 is a balloon made of an elastic material such as rubber containing air or the like in the balloon. Like the pressing pad 54 shown in FIG. 7B, the pressing balloon 57 elastically deforms upon pressing against the ring-shaped stiffening portion following the shape of the stiffening portion as shown in FIG. 11B.

The pressing balloon 57 is attached, with air or the like filling the interior thereof, to the support member 53. Alternatively, the pressing balloon 57 can be attached to, in place of the pressing member 53, a pressing balloon support member 56 provided with a supply and exhaust path to the pressing balloon 57.

The thin recessed portion and the inside of the ring-shaped stiffening portion of the wafer 22, being pushed toward the chuck table by the pressing balloon 57, does not locally float up due to blowing up of water, air, or a mixture of water and air through the attachment plates 13 and 14 like in a configuration shown in FIG. 16B.

The use of the pressing balloon support member 56 controls the pressure in the balloon, thereby adjusting degree of deformation of the balloon following the configuration of the stiffening portion and the pushing force on the stiffening portion.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-054332, filed on Mar. 11, 2011. The disclosure of the priority application, in its entirety, including the drawings, claims, and the specification thereof, is incorporated herein by reference.

The invention claimed is:

1. A method for manufacturing a semiconductor device comprising the steps of:
    attaching by suction a front surface of a semiconductor wafer onto a surface of an attachment plate of a chuck table;
    grinding from a back surface of the semiconductor wafer in an inside region thereof with a recessed configuration leaving a ring-shaped stiffening portion at the outer peripheral portion of the semiconductor wafer; and
    transporting the semiconductor wafer having the ring-shaped stiffening portion from the chuck table while holding the semiconductor wafer;
    the step of transporting the semiconductor wafer comprising the steps of:
        pressing the semiconductor wafer from the back surface side to the front surface side thereof on a place different from a place at which the semiconductor wafer is to be held, the step of pressing the semiconductor wafer being conducted before holding the semiconductor wafer having the ring-shaped stiffening portion;
        releasing attachment by suction on the front surface of the semiconductor wafer by supplying a positive pressure to the chuck table;
        releasing pressing the semiconductor wafer from the back surface side to the front surface side thereof on the place different from the place at which the semiconductor wafer is to be held, the releasing attachment by suction of the wafer being conducted in the step of pressing the semiconductor wafer; and
        picking up the semiconductor wafer having the ring-shaped stiffening portion from the chuck table while holding the semiconductor wafer at the place different from the pressing location.

2. The method of manufacturing a semiconductor device according to claim 1, wherein the step of pressing the semiconductor wafer is conducted on a place that is vulnerable to local deformation in the semiconductor wafer having the ring-shaped stiffening portion upon supplying the positive pressure on the chuck table in the step of releasing attachment.

3. The method of manufacturing a semiconductor device according to claim 1, wherein the step of pressing the semiconductor wafer comprises steps of:
    pressing the ring-shaped stiffening portion from the back surface side to the front surface side of the semiconductor wafer; and
    making an attracting member for holding the semiconductor wafer into contact with the inside region with a recessed configuration of the semiconductor wafer.

4. The method of manufacturing a semiconductor device according to claim 2, wherein the step of pressing the semiconductor wafer comprises steps of:
    pressing the ring-shaped stiffening portion from the back surface side to the front surface side of the semiconductor wafer; and
    making an attracting member for holding the semiconductor wafer into contact with the inside region with a recessed configuration of the semiconductor wafer.

5. The method of manufacturing a semiconductor device according to claim 3, wherein the step of pressing the ring-shaped stiffening portion includes a process of pushing an elastic material to the ring-shaped stiffening portion to deform the elastic material following a configuration of the ring-shaped stiffening portion.

6. The method of manufacturing a semiconductor device according to claim 3, wherein the step of picking up the semiconductor wafer includes, following the step of releasing pressing the semiconductor wafer, a process of supplying a negative pressure on the attracting member in contact with the semiconductor wafer for holding the semiconductor wafer to attract the inside region with a recessed configuration of the semiconductor wafer.

7. The method of manufacturing a semiconductor device according to claim 1, wherein the step of pressing the semiconductor wafer comprises steps of:
    pressing the inside region with a recessed configuration of the semiconductor wafer from the back surface side to the front surface side; and
    holding the ring-shaped stiffening portion from outside the ring-shaped stiffening portion.

8. The method of manufacturing a semiconductor device according to claim 2, wherein the step of pressing the semiconductor wafer comprises steps of:
pressing the inside region with a recessed configuration of the semiconductor wafer from the back surface side to the front surface side; and
holding the ring-shaped stiffening portion from outside the ring-shaped stiffening portion.

9. The method of manufacturing a semiconductor device according to claim 7, wherein the step of pressing the inside region includes a process of pushing an elastic material to the inside region with a recessed configuration and an inner circumferential part of the ring-shaped stiffening portion to deform the elastic material following a configuration of the ring-shaped stiffening portion.

10. An apparatus for manufacturing a semiconductor device, the apparatus comprising:
a chuck table that attaches a semiconductor wafer by attracting a front surface of the semiconductor wafer to be processed;
a grinding device that grinds from a back surface of the semiconductor wafer in the inside region thereof with a recessed configuration leaving a ring-shaped stiffening portion at the outer peripheral portion of the semiconductor wafer;
a transport device that transports the semiconductor wafer having the ring-shaped stiffening portion from the chuck table while holding the semiconductor wafer; wherein the transport device comprises:
a pressing device that presses the semiconductor wafer having the ring-shaped stiffening portion from the back surface side to the front surface side thereof on a place different from a place at which the semiconductor wafer is to be held;
a positive pressure supplying device that supplies a positive pressure on the chuck table to release the wafer; and
a picking up device that picks up the semiconductor wafer having the ring-shaped stiffening portion from the chuck table while holding the semiconductor wafer at the place different from the location.

11. The apparatus for manufacturing a semiconductor device according to claim 10, wherein the pressing device presses a place that is vulnerable to local deformation in the semiconductor wafer having the ring-shaped stiffening portion upon supplying the positive pressure on the chuck table by means of the positive pressure supplying device.

12. The apparatus for manufacturing a semiconductor device according to claim 10, wherein the pressing device comprises:
a stiffening portion pressing mechanism that presses the ring-shaped stiffening portion from the back surface side to the front surface side of the semiconductor wafer; and
a holding mechanism that holds the inner portion with a recessed configuration of the semiconductor wafer.

13. The apparatus for manufacturing a semiconductor device according to claim 11, wherein the pressing device comprises:
a stiffening portion pressing mechanism that presses the ring-shaped stiffening portion from the back surface side to the front surface side of the semiconductor wafer; and
a holding mechanism that holds the inner portion with a recessed configuration of the semiconductor wafer.

14. The apparatus for manufacturing a semiconductor device according to claim 12, wherein the stiffening portion pressing mechanism has a portion made of an elastic material to become in contact with the ring-shaped stiffening portion.

15. The apparatus for manufacturing a semiconductor device according to claim 12, wherein the holding mechanism includes an attracting mechanism that attracts the inner portion with a recessed configuration of the semiconductor wafer.

16. The apparatus for manufacturing a semiconductor device according to claim 12, wherein the stiffening portion pressing mechanism has a sliding member for supporting the stiffening portion pressing mechanism itself, the sliding member being coupled with a support member for supporting the holding mechanism around a common axis such that the stiffening portion pressing mechanism and the holding mechanism vertically move independently of each other.

17. The apparatus for manufacturing a semiconductor device according to claim 10, wherein the pressing device comprises:
an inner region pressing mechanism that presses the inner portion with a recessed configuration of the semiconductor wafer from the back surface side to the front surface side; and
a holding mechanism that holds the ring-shaped stiffening portion of the semiconductor wafer from outside of the stiffening portion.

18. The apparatus for manufacturing a semiconductor device according to claim 11, wherein the pressing device comprises:
an inner region pressing mechanism that presses the inner portion with a recessed configuration of the semiconductor wafer from the back surface side to the front surface side; and
a holding mechanism that holds the ring-shaped stiffening portion of the semiconductor wafer from outside of the stiffening portion.

19. The apparatus for manufacturing a semiconductor device according to claim 17, wherein the inner region pressing mechanism has a portion made of an elastic material to become in contact with the inner portion with a recessed configuration and an inner circumferential region of the ring-shaped stiffening portion of the semiconductor wafer.

* * * * *

UNITED STATES PATENT AND TRADEMARK OFFICE
CERTIFICATE OF CORRECTION

| | |
|---|---|
| PATENT NO. | : 8,888,557 B2 |
| APPLICATION NO. | : 13/414925 |
| DATED | : November 18, 2014 |
| INVENTOR(S) | : Yoko Tanaka |

It is certified that error appears in the above-identified patent and that said Letters Patent is hereby corrected as shown below:

In the Claims,

Claim 10, column 15, line 42, before "location": INSERT: -- pressing --.

Signed and Sealed this
Tenth Day of March, 2015

Michelle K. Lee
*Deputy Director of the United States Patent and Trademark Office*